US012811532B2

(12) United States Patent
Egi

(10) Patent No.: US 12,811,532 B2
(45) Date of Patent: Nov. 24, 2026

(54) PWM CONTROL APPARATUS

(71) Applicant: OKUMA Corporation, Niwa-gun (JP)

(72) Inventor: Yoshimasa Egi, Niwa-gun (JP)

(73) Assignee: OKUMA CORPORATION, Niwa-gun (JP)

( * ) Notice: Subject to any disclaimer, the term of this patent is extended or adjusted under 35 U.S.C. 154(b) by 120 days.

(21) Appl. No.: 18/895,932

(22) Filed: Sep. 25, 2024

(65) Prior Publication Data

US 2025/0112579 A1 Apr. 3, 2025

(30) Foreign Application Priority Data

Oct. 3, 2023 (JP) ................................ 2023-171797

(51) Int. Cl.
*H03K 7/00* (2006.01)
*H02P 27/08* (2006.01)
*H03K 7/08* (2006.01)

(52) U.S. Cl.
CPC ............... *H02P 27/08* (2013.01); *H03K 7/08* (2013.01)

(58) Field of Classification Search
CPC ........ H03K 3/017; H03K 5/04; H03K 5/1565; H03K 7/08; H03K 5/12; H02P 27/08
See application file for complete search history.

(56) References Cited

U.S. PATENT DOCUMENTS

| | | | | |
|---|---|---|---|---|
| 5,481,560 | A * | 1/1996 | Potetz | H03K 7/08 332/110 |
| 5,485,487 | A * | 1/1996 | Orbach | G06F 1/025 370/212 |
| 7,184,480 | B1 * | 2/2007 | Gheorghiu | H03K 7/08 375/353 |
| 9,859,909 | B1 * | 1/2018 | Cowan | H03M 1/1235 |
| 2005/0285582 | A1 * | 12/2005 | Azuma | H02M 7/53873 323/282 |
| 2024/0290364 | A1 * | 8/2024 | Valencia Rissetto | G06N 3/065 |

FOREIGN PATENT DOCUMENTS

JP 2016019276 A 2/2016

* cited by examiner

*Primary Examiner* — Tuan T Lam
(74) *Attorney, Agent, or Firm* — CANTOR COLBURN LLP

(57) ABSTRACT

A PWM control apparatus includes a normalization counter. The normalization counter counts up or down by an average of 2^N/Cmax between 0 and 2^N for each input of a clock signal. Here, N is a natural number, and Cmax is a value changing according to a carrier period. The PWM control apparatus further includes a comparator configured to compare a normalization count value of the normalization counter with a comparison value for determining a duty ratio of a PWM signal and output a comparison result as a PWM signal.

4 Claims, 15 Drawing Sheets

WHEN COUNT CONVERSION VALUE IS ROUNDED OFF

WHEN COUNT CONVERSION VALUE IS TRUNCATED

IN CASE OF COMPARISON FIXED-POINT BIT WIDTH n = 0

IN CASE OF COMPARISON FIXED-POINT BIT WIDTH n = 1

PWM CONTROL APPARATUS

CROSS REFERENCE TO RELATED APPLICATION

The present invention claims priority under 35 U.S.C. § 119 to Japanese Patent Application No. 2023-171797 filed on Oct. 3, 2023, the entire content of which is incorporated herein by reference.

TECHNICAL FIELD

The present disclosure relates to a pulse width modulation (PWM) control apparatus that generates a PWM signal for inverter control, etc. of a motor.

BACKGROUND

In a motor control apparatus that uses a three-phase motor to control a speed and a rotation angle (position) of a load, a PWM inverter that drives a three-phase voltage-type inverter using a PWM signal is usually adopted as a power converter, and a microcontroller, etc. incorporating a PWM circuit as a peripheral device is used as a control processor.

FIG. 9 is a block diagram illustrating a configuration of a conventional PWM circuit 5*a* when outputting a so-called triangular wave PWM signal.

The PWM circuit 5*a* includes a PWM counter 51, a counter upper limit storage 52, comparison value storages 53*a*, 53*b*, and 53*c*, comparators 54*a*, 54*b*, and 54*c*, and complementary and dead time generators 55*a*, 55*b*, and 55*c*. The PWM counter 51 counts up and down a clock signal (not illustrated). The counter upper limit storage 52 stores a count upper limit for determining a carrier period of PWM. The comparison value storages 53*a*, 53*b*, and 53*c* store comparison values for determining duty ratios of PWM signals of U, V, and W-phases. The comparators 54*a*, 54*b*, and 54*c* compare a value of the PWM counter 51 with values of the comparison value storages 53*a*, 53*b*, and 53*c*, respectively, and generate an active PWM signal when the value of the PWM counter 51 falls below the values of the comparison value storages 53*a*, 53*b*, and 53*c*. The complementary and dead time generators 55*a*, 55*b*, and 55*c* output a positive-phase PWM signal and a negative-phase PWM signal in a complementary relationship in consideration of a dead time from the PWM signals generated by the comparators 54*a*, 54*b*, and 54*c*. Various means for implementing the complementary and dead time generators 55*a*, 55*b*, and 55*c*, for example, a configuration disclosed in JP 2016-19276 A, have been known.

FIG. 12 is a timing chart illustrating PWM output of a U-phase of the PWM circuit 5*a* having the configuration illustrated in FIG. 9. Note that, for simplicity, FIG. 12 illustrates an example in which the dead time is 0.

The PWM counter 51 counts a clock signal (not illustrated). A counter upper limit is input to the PWM counter 51 from the counter upper limit storage 52. The PWM counter 51 outputs a PWM count value that counts up or down between 0 and the counter upper limit, and an up-down identification signal that indicates a current count direction. The PWM count value is input to an inverting input terminal of the comparator 54*a*. A comparison value is input to a non-inverting input terminal of the comparator 54*a* from the comparison value storage 53*a*. The comparator 54*a* compares the PWM count value with the comparison value, and outputs ON when the PWM count value is equal to or less than the comparison value, outputs OFF when the PWM count value exceeds the comparison value, and outputs ON when the PWM count value falls below the comparison value. The PWM signal output by the comparator 54*a* is input to the complementary and dead time generator 55*a*. The complementary and dead time generator 55*a* outputs the PWM signal output by the comparator 54*a* as a positive-phase PWM signal, and outputs an inverted signal as a negative-phase PWM signal. Note that, in practice, between positive-phase ON and negative-phase ON, a dead time during which both are OFF is inserted to prevent simultaneous ON due to a switching time of an inverter, which is omitted in FIG. 12. A counter upper limit update value input from outside the PWM circuit is stored in and output to the counter upper limit storage 52 as a counter upper limit at the timing when down-counting changes to up-counting based on an up-down identification signal input from the PWM counter 51. A U-phase comparison value update value input from outside the PWM circuit is stored in and output to the comparison value storage 53*a* as a U-phase comparison value at the timing when a count direction changes based on the up-down identification signal input from the PWM counter 51. The above description for the U-phase is applied to the V-phase and the W-phase, and the comparison value storages 53*b* and 53*c*, the comparators 54*b* and 54*c*, and the complementary and dead time generators 55*b* and 55*c* for the V-phase and the W-phase have the same functions as those of the comparison value storage 53*a*, the comparator 54*a*, and the complementary and dead time generator 55*a* for the U-phase, respectively.

A carrier period of the PWM signal can be expressed by the following Equation (1) using a period of a clock signal input to the PWM circuit and the counter upper limit stored in the counter upper limit storage 52.

$$\text{Carrier period} = \text{clock period} \times \text{counter upper limit} \times 2 \quad (1)$$

In addition, a comparison value for a duty ratio of 50% is ½ the counter upper limit. Therefore, even when the duty ratio is the same, the comparison value differs depending on the counter upper limit determined from the carrier period and the clock period. FIG. 12 illustrates a case in which a second carrier period (T2) is made larger than a first carrier period (T1). In this case, a counter upper limit of T2 is larger than a counter upper limit of T1. FIG. 12 illustrates a difference in a comparison value for a 50% duty in a latter half (down-counting section) of the first carrier period (T1) and a first half (up-counting section) of the second carrier period (T2).

FIG. 10 is a block diagram illustrating a configuration of a motor system using a microcontroller 1 incorporating the conventional PWM circuit 5*a* described with reference to FIG. 9 and FIG. 12. The microcontroller 1 functions as a motor control apparatus. The motor system of FIG. 10 will be described below. A command value X is output to the microcontroller 1 from a host control apparatus (not illustrated). The command value X is a speed or a rotation angle of a load. The motor system includes an encoder 9 that detects a rotation angle of a motor 7. A rotation angle of the motor 7 is a position detection value of a load 8 that is connected to and driven by the motor 7 and is output as a position detection value Om via an encoder interface 13. In addition, the motor system includes a three-phase voltage-type inverter 6 driven by a PWM signal output by the microcontroller 1. The three-phase voltage-type inverter 6 supplies power to the motor 7. Currents of at least two phases (for example, In and Iv) of three-phase currents (Iu, Iv, Iw) flowing through the motor 7 are detected by current detectors 10 and 11 and output as current detection values Iud and Ivd via an A/D converter 12.

The microcontroller 1, in accordance with a stored program, sequentially performs calculations of a position/speed control process 2, a current control process 3*a*, and a PWM output rate conversion process 4*a* using an incorporated CPU. The position/speed control process 2 receives the command value X and the position detection value Om as input, performs a feedback process by a position control loop and a speed control loop, and various feedforward processes, and outputs a torque command value Tc. The current control process 3*a* receives the torque command value Tc and the current detection values Iud and Ivd, performs a feedback process by a current control loop, and a feedforward process based on, for example, dq-axis control theory, and outputs voltage command values Vuc, Vvc, and Vwc of three phases (U-phase, V-phase, and W-phase). The PWM output rate conversion process 4*a* converts the voltage command values Vuc, Vvc, and Vwc into comparison values for the PWM circuit 5*a* and sets the values in the PWM circuit 5*a*. The PWM circuit 5*a* is the conventional PWM circuit described with reference to FIGS. 9 and 12, and is a logic circuit incorporated in the microcontroller 1 as a peripheral device.

Normally, the voltage command values Vuc, Vvc, and Vwc are normalized by a power of 2 and output. That is, in a three-phase voltage-type inverter having a DC voltage Vdc, when Vdc/2 is defined as an output voltage of 0 V, an output voltage range is −Vdc/2 to +Vdc/2. For the voltage command values Vuc, Vvc, and Vwc, a lower limit −Vdc/2 of the output voltage range is set as PWM output rate −100% (negative phase 100% ON), an upper limit +Vdc/2 of the output voltage range is set as PWM output rate+100% (positive phase 100% ON), and the PWM output rate 100% is normalized by the Nth power of 2 (hereinafter referred to as 2^N). Here, N is a natural number.

When the voltage command values Vuc, Vvc, and Vwc are normalized by 2^N', the counter upper limit is set to Cmax, and the PWM output rate conversion process 4*a* performs the calculations of the following Equations (2) to (4). Here, division by 2^(N'+1) can be achieved by a bit shift operation, and thus the calculation load can be reduced.

$$U\text{-phase comparison value update value} = Vuc \times \text{Cmax}/2^{\wedge}(N'+1) + \text{Cmax}/2 \tag{2}$$

$$V\text{-phase comparison value update value} = Vvc \times \text{Cmax}/2^{\wedge}(N'+1) + \text{Cmax}/2 \tag{3}$$

$$W\text{-phase comparison value update value} = Vwc \times \text{Cmax}/2^{\wedge}(N'+1) + \text{Cmax}/2 \tag{4}$$

Note that a counter upper limit Cmax may be a fixed value not synchronized with the PWM signal carrier, the position/speed control process 2, and the current control process 3*a*, or may be variable to be synchronized with the PWM signal carrier, the position/speed control process 2, and the current control process 3*a*. When the counter upper limit Cmax is variable, a carrier frequency changer (not illustrated) measures the timing between the PWM signal carrier, the position/speed control process 2, and the current control process 3*a*, changes the counter upper limit Cmax within a certain range (for example, within a range of plus/minus a few percent) relative to a reference value of the counter upper limit, and outputs the changed counter upper limit Cmax.

CITATION LIST

PATENT DOCUMENT 1: JP 2016-19276 A

SUMMARY

In the PWM inverter, a power semiconductor such as an IGBT is switched at a carrier frequency of the PWM signal, and thus a ripple current that depends on the carrier frequency is generated. From the viewpoint of reducing ripple current, a higher carrier frequency might be better. However, when the carrier frequency is increased, there is a problem of increased switching loss in the power semiconductor proportional to the carrier frequency, as well as a problem with microcontroller performance due to the need to complete current control calculation in a shorter time.

In recent years, the application of a power semiconductor using a wide band gap semiconductor such as SiC, which can perform switching at higher speed than a conventional power semiconductor using Si, has expanded, and carrier frequency restrictions caused by switching losses have been improved. In addition, performance improvements and cost reductions of devices capable of programming logic circuits such as FPGAs have progressed, and by implementing a current control process as a logic circuit using FPGAs, it has become possible to improve carrier frequency restrictions caused by microprocessor performance without developing ASICs.

FIG. 11 is a block diagram illustrating a configuration of a motor system including a motor control apparatus using a microcontroller and an FPGA. In the following, only the parts different from those of the motor control apparatus described above with reference to FIG. 10 will be described.

An FPGA 14 operates a current control circuit 3*b*, a PWM output rate conversion circuit A (reference symbol 4*b*), and a PWM circuit 5*a* in parallel by a programmed logic circuit. The current control circuit 3*b* realizes a function equivalent to that of the current control process 3*a* realized by an operation process of the microcontroller in the conventional example of FIG. 10 using a logic circuit, receives the torque command value Tc and the current detection values Iud and Ivd as inputs, performs a feedback process by a current control loop, and a feedforward process based on, for example, the dq-axis control theory, and outputs the voltage command values Vuc, Vvc, and Vwc of the three phases (U phase, V phase, and W phase). Similarly, the PWM output rate conversion circuit A (reference symbol 4*b*) realizes a function equivalent to that of the PWM output rate conversion process 4*a* realized by an operation process of the microcontroller in the conventional example of FIG. 10 using a logic circuit, converts the voltage command values Vuc, Vvc, and Vwc into comparison value update values (U phase, V phase, and W phase) for the PWM circuit 5*a*, and outputs the converted values.

Here, the PWM output rate conversion circuit A (reference symbol 4*b*) needs to perform the calculations of the above-mentioned Equations (2) to (4) using logic circuits, and therefore requires three multiplication circuits.

In an FPGA, hardware multipliers that can perform multiplication processes at high speed are a finite resource, and it is desirable to reduce the number of multipliers used. It is also possible to realize a multiplication circuit using a programmable logic element (hereinafter referred to as LE). However, when a circuit that realizes multiplication in one clock is configured using an LE, the amount of LE usage and the operating speed become issues. It is possible to improve the amount of LE usage and the operating speed by making the circuit perform multiplication in a plurality of clocks. However, this leads to a decrease in throughput and is a disadvantage in terms of the purpose of using the FPGA, which is to speed up the current control process by implementing the current control process in a logic circuit.

Further, in the example of FIG. 11, in which the current control process is accelerated by the logic circuit of the FPGA, current detection is oversampled with respect to the carrier frequency, and a filtering process is performed based on a relationship between the AD conversion timing and the switching timing based on the PWM counter, whereby the use of reducing ripple components superimposed on the current and improving accuracy of current detection is also assumed. However, since an upper limit of the PWM counter in the PWM circuit 5*a* is not normalized, a phase relationship between the PWM counter and the current detection timing cannot be easily determined, and there is a problem in that use for the filtering process with respect to current detection is difficult.

A PWM control apparatus according to the disclosure includes a normalization counter configured to count up or down by an average of 2^N/Cmax between 0 and 2^N for each input of a clock signal, in which N is a natural number and Cmax is a value changing according to a carrier period, and the PWM control apparatus further includes a comparator configured to compare a normalization count value of the normalization counter with a comparison value for determining a duty ratio of a PWM signal and output a comparison result as a PWM signal.

The PWM control apparatus according to the disclosure may further include a PWM counter configured to count up or down by 1 between 0 and Cmax for each input of the clock signal; counter comparison means configured to compare a count conversion value, which is a product of the normalization count value and Cmax, with a PWM count value of the PWM counter after digits alignment, and output a result as a counter comparison result; and counter increment calculation means, in which 2^N/Cmax may be defined as a counter increment reference value ΔC, the counter increment calculation means may be configured to acquire, as a provisional counter increment value, ΔC when the PWM counter is counted up and −ΔC when the PWM counter is counted down, acquire a value obtained by shifting ΔC to the right by m bits as a counter correction reference value ΔCc, acquire, as a counter correction value, ΔCc when the PWM counter value is greater than the count conversion value in the counter comparison result, −ΔCc when the PWM counter value is less than the count conversion value, and 0 when the PWM counter value is equal to the count conversion value, and acquire, as a counter increment value, a value obtained by adding the counter correction value to the provisional counter increment value, and the normalization counter may update a normalization count value by adding the count increment value to a current normalization count value when the clock signal is input.

In the PWM control apparatus according to the disclosure, the counter comparison means may perform comparison with the PWM count value of the PWM counter by digits alignment using, as significant digits, figures up to an nth decimal point among N fixed-point digits included in the count conversion value, and n may satisfy a relationship of 2^n≥Cd with respect to a number of delay clocks Cd until the normalization count value is reflected in update of the normalization count value via the counter comparison means and the counter increment calculation means.

In the PWM control apparatus according to the disclosure, m, which is a shift amount of the counter correction reference value ΔCc, may satisfy a relationship of m0−1≤m≤m0+1 with respect to a smallest integer m0 satisfying 2^m0≥Cd×2^n for n in digits alignment of the counter comparison means and the number of delay clocks Cd.

In the PWM control apparatus according to the disclosure, fixed-point bits less than or equal to the m bits may be added to an internal count value of the normalization counter and the counter increment reference value of the counter increment calculation means so that ΔC/2^m does not become 0 with respect to ΔC and m.

According to the disclosure, an upper limit of a normalization count value (carrier) compared with a comparison value for determining a duty ratio of a PWM signal can be made constant without depending on the carrier period. Therefore, even when the carrier period is changed, a comparison value at the same duty ratio remains constant, and a conventional multiplier for the comparison value (multiplier in a PWM output rate conversion circuit) can be eliminated. Furthermore, by extracting upper bits of the normalization count value, it is possible to easily acquire a phase relationship of one unit in a power of two with respect to the PWM carrier period, which makes it easier to perform correction calculation such as a filtering process for current detection.

BRIEF DESCRIPTION OF DRAWINGS

Embodiment(s) of the present disclosure will be described based on the following figures, wherein.

DESCRIPTION OF EMBODIMENTS

Figure 1:
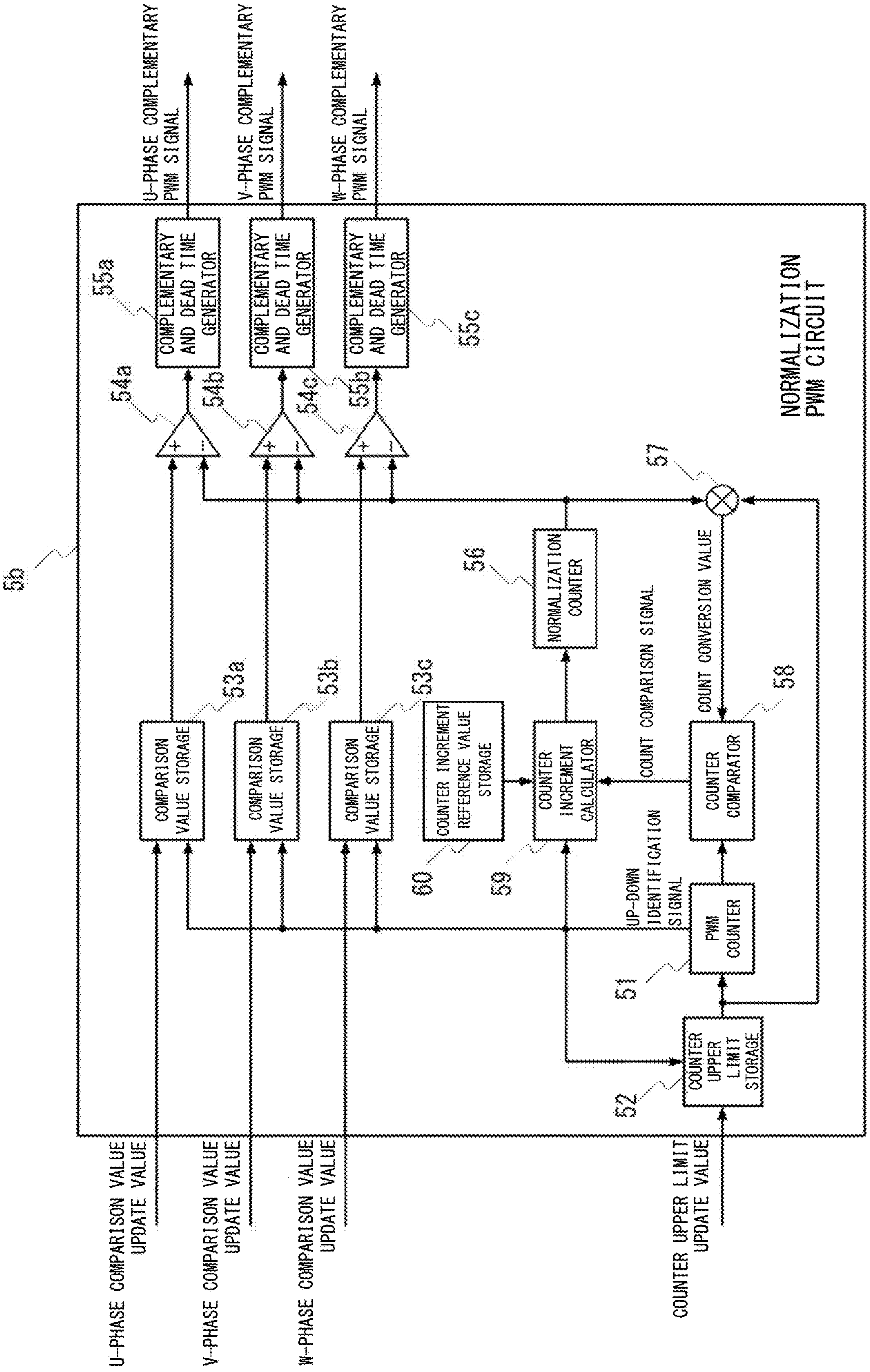
FIG. 1 is a block diagram illustrating a normalization PWM circuit according to an embodiment.
Figure 2:
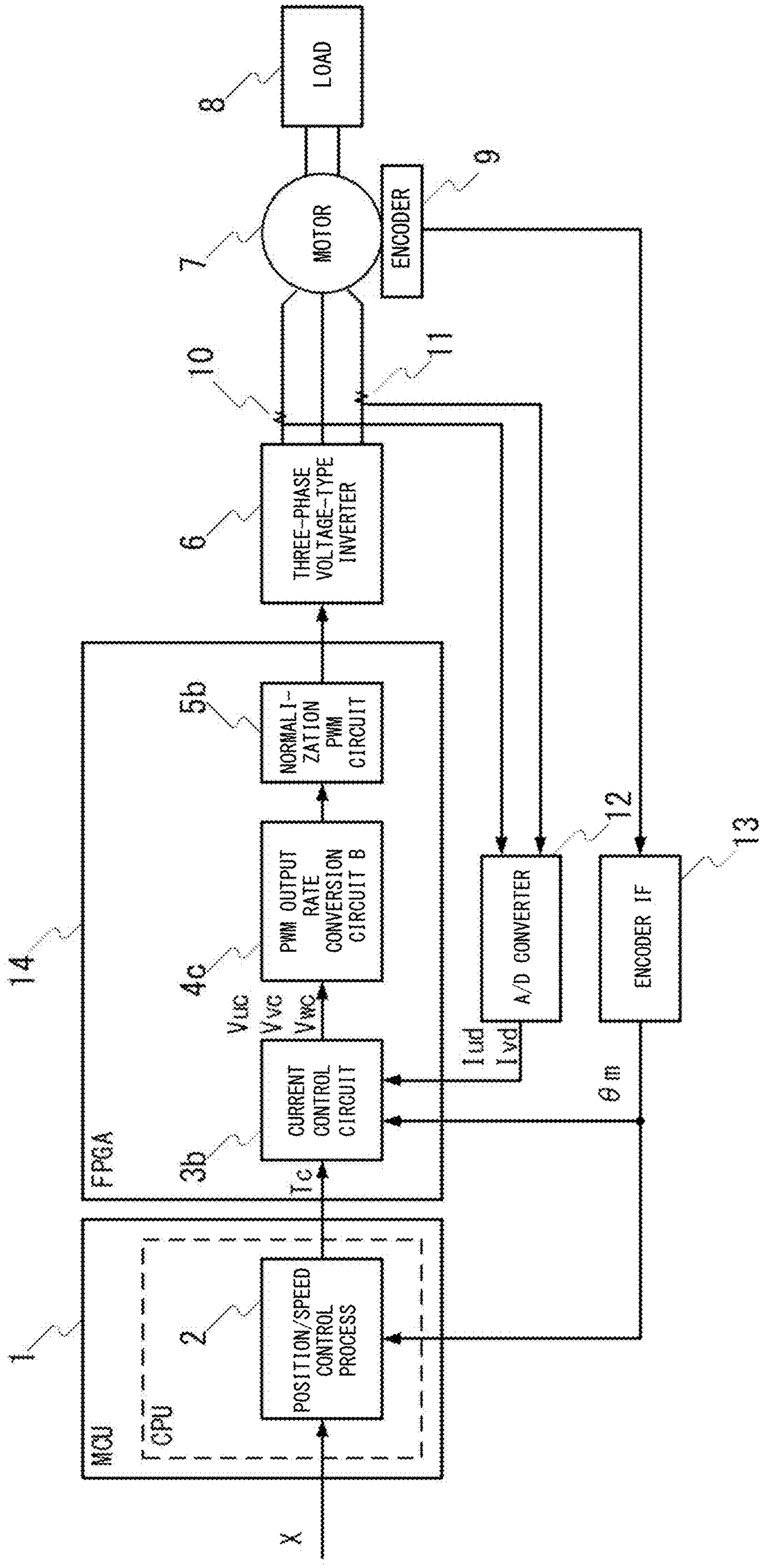
FIG. 2 is a block diagram illustrating a motor system including a motor control apparatus using a microcontroller and an FPGA according to an embodiment.

Hereinafter, an embodiment of the disclosure will be described with reference to the drawings. In the following, a case where a so-called triangular wave PWM signal is output will be described. FIG. 1 is a block diagram illustrating a normalization PWM circuit 5*b* according to an embodiment. FIG. 2 is a block diagram illustrating a motor system including a motor control apparatus using a microcontroller and an FPGA according to an embodiment. When compared to the motor control apparatus (conventional art) of FIG. 11, the motor control apparatus of FIG. 2 uses a PWM output rate conversion circuit B (reference symbol 4*c*), which does not require multiplication, instead of the PWM output rate conversion circuit A (reference symbol 4*b*), which requires multiplication, and uses a normalization PWM circuit 5*b* instead of the PWM circuit 5*a*. In the following, only differences from the conventional arts described above will be described. Note that, in the following, output of a PWM counter 51 will be referred to as a PWM count value or a PWM counter value. Further, output of a counter comparator 58 (see FIG. 1) will be referred to as a count comparison signal, a counter comparison signal, or a counter comparison result.

The PWM control apparatus includes the normalization PWM circuit 5*b*. The normalization PWM circuit 5*b* of FIG. 1 includes a normalization counter 56 that counts up and down from 0 to 2^N in synchronization with up and down counting of the PWM counter 51 from 0 to a counter upper limit Cmax. In the normalization PWM circuit 5*b*, instead of the PWM count value of the PWM counter 51, a normalization count value of the normalization counter 56 is output to non-inverting input terminals of comparators 54*a*, 54*b*, and 54*c*, thereby outputting a PWM signal using the normalization count value as a carrier. The normalization count value is multiplied by the counter upper limit Cmax stored in a counter upper limit storage 52 by a multiplier 57 and is output to the counter comparator 58 as a count conversion value. That is, the count conversion value can be expressed by Equation (5) below. Note that the count conversion value includes N fixed-point bits. Note that the reason why the count conversion value includes the N fixed-point bits is that the normalization count value is normalized by 2^N with respect to the counter upper limit Cmax; that is, when considered based on Cmax, the normalization count value includes N fixed-point bits.

$$\text{Count conversion value} = \text{normalization count value} \times C\text{max} \quad (5)$$

The counter comparator 58 compares the PWM count value with the count conversion value and outputs a count comparison signal to a counter increment calculator 59. The count comparison signal is output as 1 when the PWM count value is greater than the count conversion value, as −1 when the PWM count value is smaller than the count conversion value, and as θ when the PWM count value is equal to the count conversion value. Note that the above output value examples are determined for the convenience of describing the function of the present embodiment, and do not limit the actual form. The counter increment calculator 59 receives as inputs a counter increment reference value stored in a counter increment reference value storage 60, the counter comparison signal, and an up-down identification signal output by the PWM counter 51 and calculates and outputs a count increment value. The normalization counter 56 adds the count increment value to the normalization count value by inputting a clock signal (not illustrated).

The counter increment reference value is calculated using Equation (6) below by the microcontroller 1 of FIG. 2 based on a reference value Cmax0 of the counter upper limit Cmax and a counter upper limit 2^N of the normalization counter and is set in advance in the counter increment reference value storage 60 using an initial setting method (not illustrated). Note that the counter increment reference value is a natural number.

$$\text{Counter increment reference value} = 2^{\wedge}N/C\text{max0} \quad (6)$$

Figure 3:
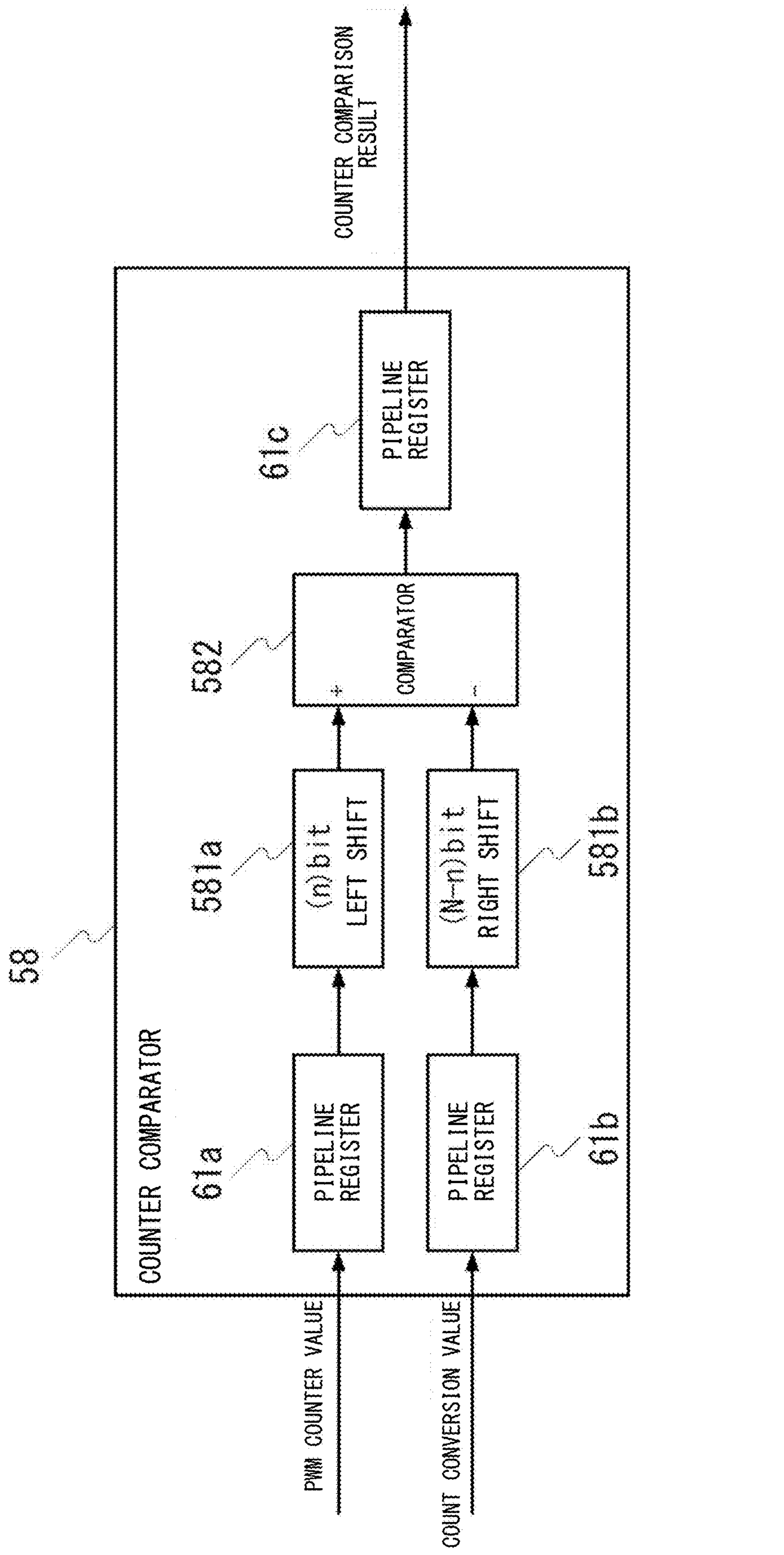
FIG. 3 is a block diagram illustrating a counter comparator according to an embodiment.

FIG. 3 is a block diagram illustrating a configuration example of the counter comparator 58. The counter comparator 58 has pipeline registers 61*a*, 61*b*, and 61*c* that latch and output input values using a clock signal (not illustrated) for a PWM counter value and a count conversion value, which are inputs, and a counter comparison result, which is output. The PWM counter value latched by the pipeline register 61*a* and the count conversion value latched by the pipeline register 61*b* are subjected to digits alignment by shift calculators 581*a* and 581*b*, and then input to a comparator 582. The comparator 582 outputs 1 when a latch value of the PWM counter value is greater than a latch value of the count conversion value, outputs −1 when the latch value of the PWM counter value is less than the latch value of the count conversion value, and outputs 0 when the latch value of the PWM counter value is equal to the latch value of the count conversion value. Output of the comparator 582 is latched by a clock signal (not illustrated) through the pipeline register 61*c*, and output as a counter comparison result. Note that, when a sufficient operating frequency can be ensured without providing the pipeline registers, the pipeline registers 61*a*, 61*b*, and 61*c* may be omitted. However, valid and invalid states of the pipeline registers 61*a* and 61*b* need to be the same.

Here, digits alignment by the shift calculator 581*a* and the shift calculator 581*b* will be described. As described above, the count conversion value includes an N fixed-point bit for the PWM counter value. In order for the comparator 582 to perform a comparison including an n-bit fixed-point, the shift calculator 581*a* shifts the latch value of the PWM counter left by n bits; that is, adds n bits of 0 to a position lower than the LSB of the latch value of the PWM counter, and the shift calculator 581*b* shifts the latch value of the count conversion value to the right by (N−n) bits; that is, extracts an nth bit as the LSB. A method of determining n will be described later.

Figure 4:
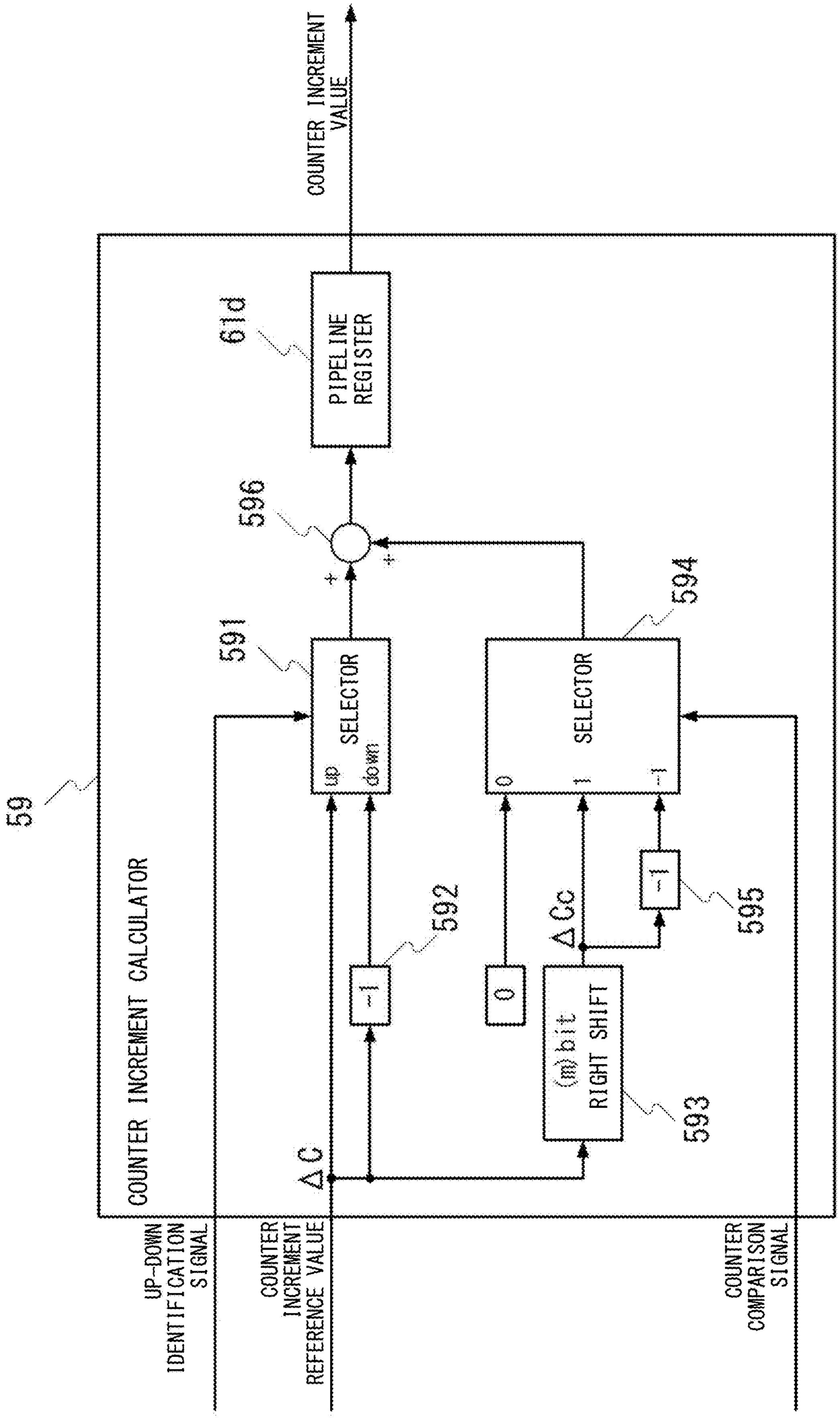
FIG. 4 is a block diagram illustrating a counter increment calculator according to an embodiment.

FIG. 4 is a block diagram illustrating a configuration example of the counter increment calculator 59. A count direction selector 591 switches between and outputs a counter increment reference value (hereinafter referred to as ΔC) and −ΔC whose sign is inverted by a sign inverter 592, depending on the up-down identification signal. That is, ΔC is output when the up-down identification signal indicates up-counting, and −ΔC is output when the up-down identification signal indicates down-counting. A shift calculator 593 shifts ΔC to the right by m bits; that is, extracts an mth bit as the LSB, and outputs a counter correction reference value ΔCc. A counter correction value selector 594 switches among and outputs ΔCc, −ΔCc whose sign is inverted by a sign inverter 595, and 0, depending on the counter comparison signal. That is, ΔCc is output when the counter comparison signal is 1, −ΔCc is output when the counter comparison signal is −1, and 0 is output when the counter comparison signal is 0. An adder 596 adds output of the count direction selector 591 and output of the counter correction value selector 594 and outputs a result. The output of the adder 596 is latched by a pipeline register 61*d* using a clock signal (not illustrated) and output as a counter increment value. Note that, when a sufficient operating frequency can be ensured without providing a pipeline register, the pipeline register 61*d* may be omitted. A method of determining the number of shifts m of the shift calculator 593 will be described later.

Note that, in the following, the number of delay clocks in a feedback path until the normalization count value of the normalization counter 56 of FIG. 1 is reflected in update of the normalization count through the multiplier 57, the counter comparator 58, and the counter increment calculator 59 is defined as Cd. The number of delay clocks Cd is Cd=L+1, where L is the number of stages of the pipeline register inserted in the feedback path.

Figure 5A:
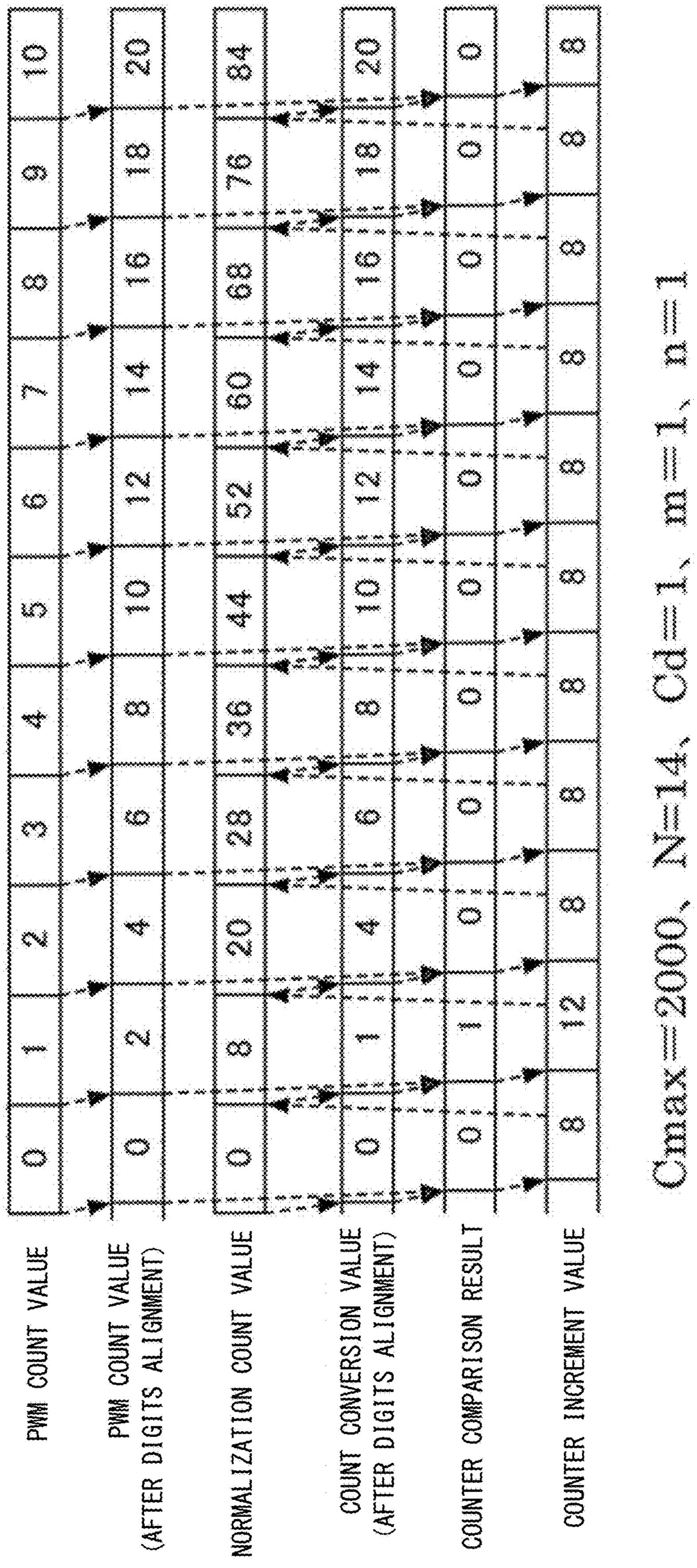
FIG. 5A is a timing chart illustrating an example of change in an internal signal in an embodiment.
Figure 5B:
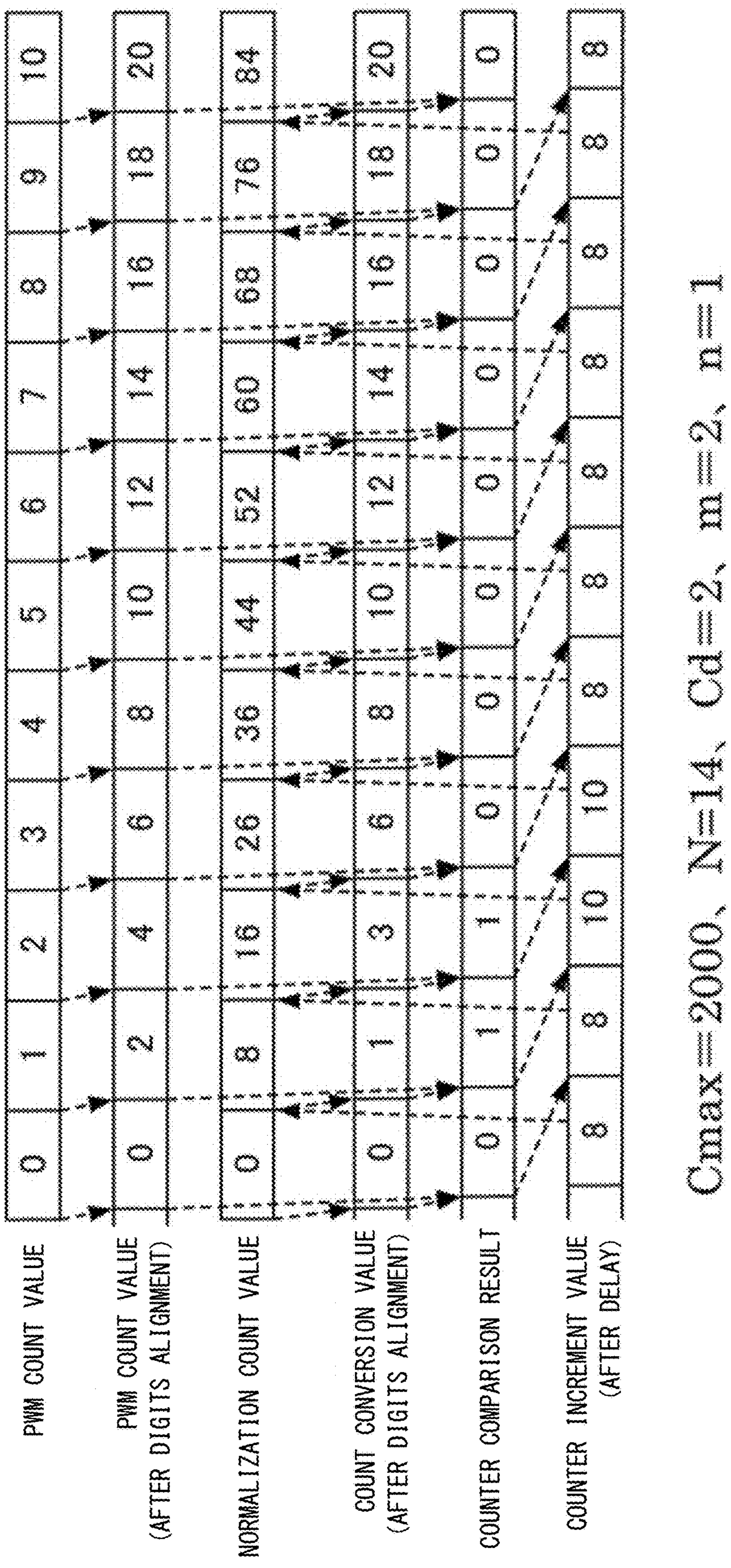
FIG. 5B is a timing chart illustrating an example of change in an internal signal in an embodiment.

FIG. 5A and FIG. 5B are timing charts each illustrating an example of change in an internal signal. FIG. 5A is a timing chart for the case where Cmax=2000, N=14, Cd=1, m=1, and n=1. FIG. 5B is a timing chart for the case where Cmax=2000, N=14, Cd=2, m=2, and n=1. Note that, in FIG. 5A and FIG. 5B, the PWM count value (after digits alignment) represents output of the shift calculator 581*a* of FIG. 3. Further, the count conversion value (after digits alignment) is output of the shift calculator 581*b* of FIG. 3, and represents a value obtained by truncation to significant digits.

Figure 6A:
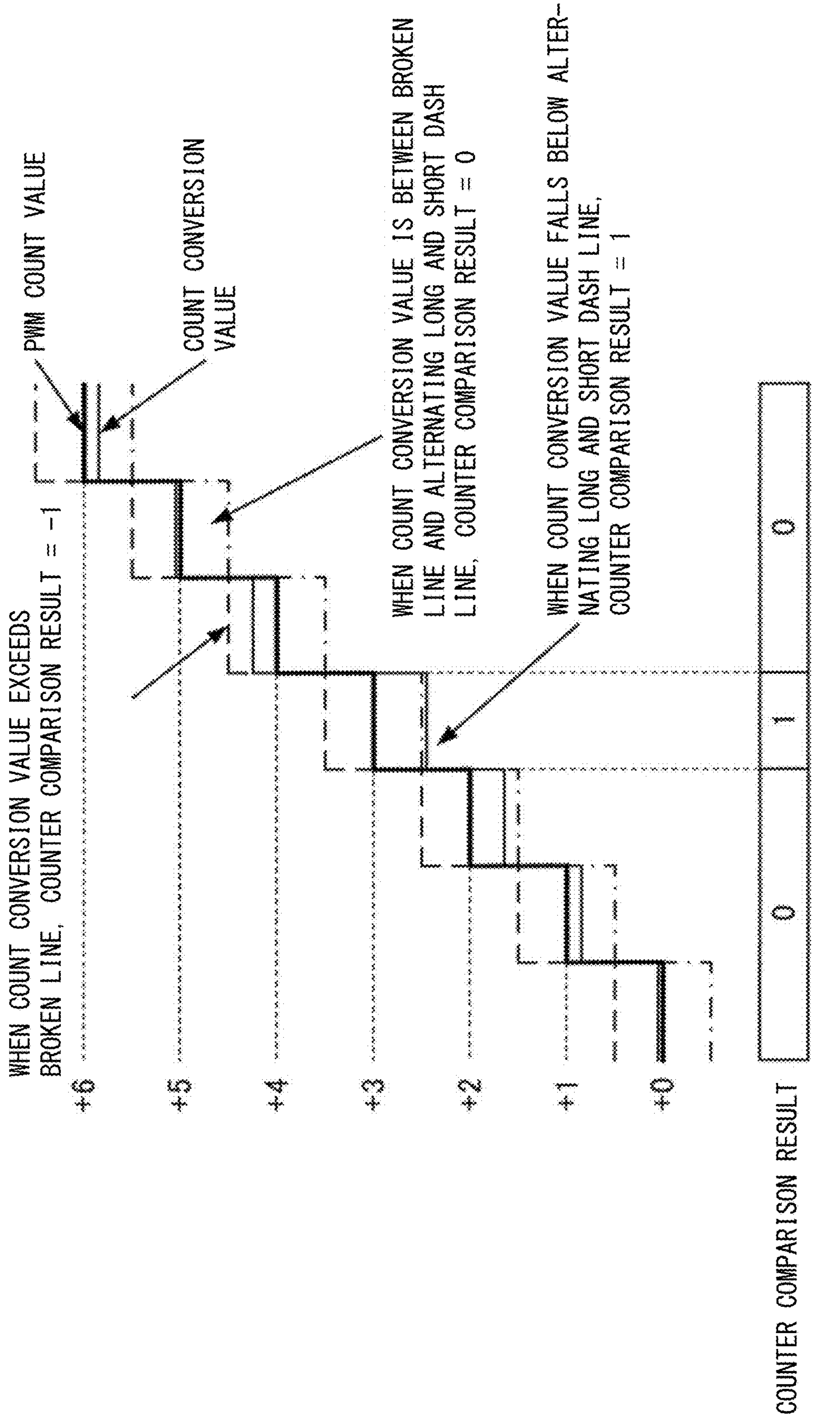
FIG. 6A is an explanatory diagram of a relationship between a PWM count value and a count conversion value (Cd=1) according to an embodiment.
Figure 6B:
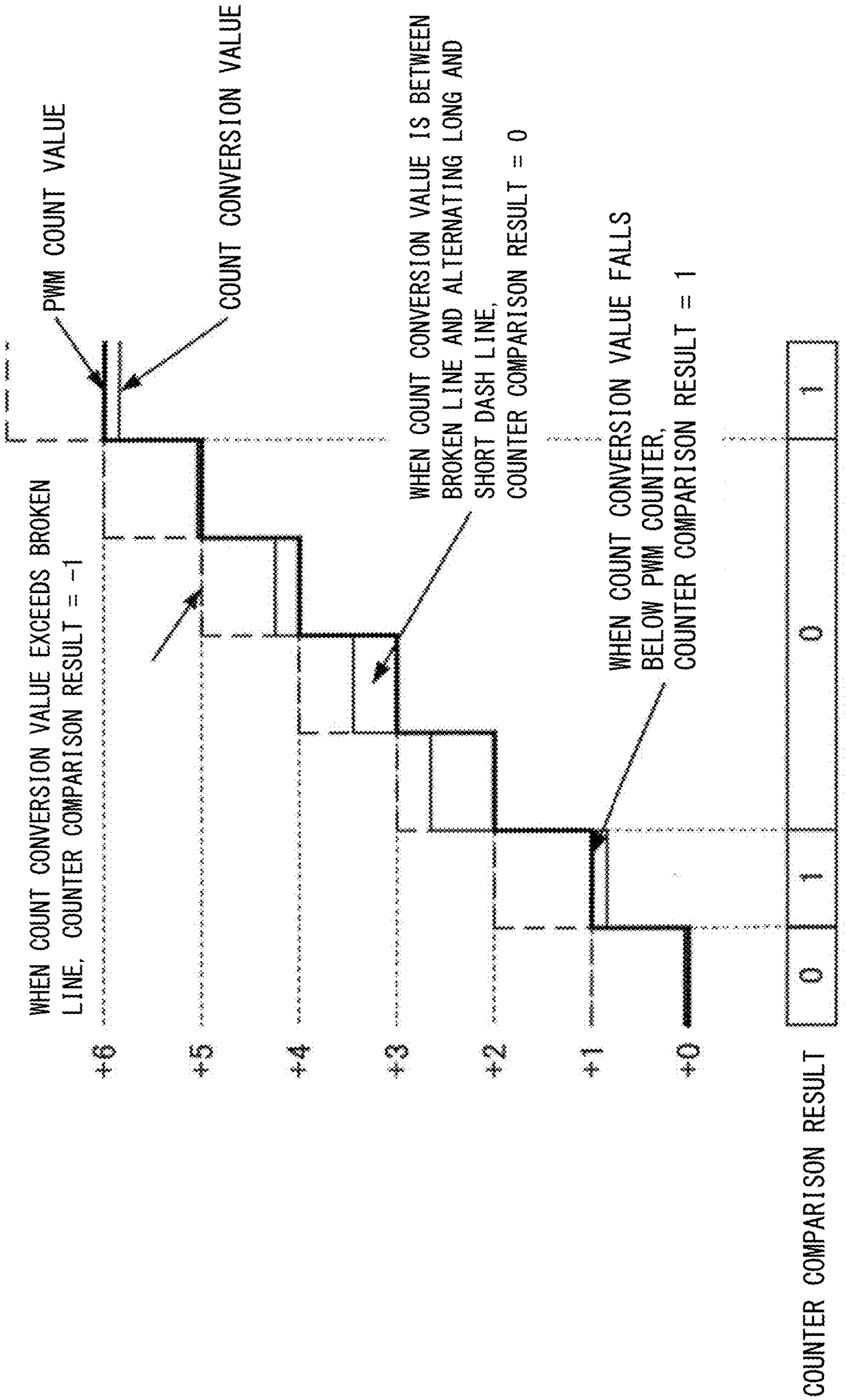
FIG. 6B is an explanatory diagram of a relationship between a PWM count value and a count conversion value (Cd=1) according to an embodiment.

Here, the counter comparator 58 will be further described. FIG. 6A and FIG. 6B are examples of timing charts of the PWM count value and the count conversion value when a comparison fixed-point bit width n=0 and Cd=1. In these figures, the count conversion value is represented as a value (plot position) including a fixed-point part. FIG. 6A illustrates a case where a value obtained by rounding the count conversion value to significant digits (here, the decimal part since n=0) is compared with the PWM count value. FIG. 6B illustrates a case where a value obtained by truncation to significant digits (here, the decimal part since n=0) of the count conversion value is compared with the PWM count value.

The counter comparison result output by the counter comparator 58 is normally 0, and when a difference between the PWM count value and the count conversion value after digits alignment exceeds a certain range, the counter comparison result becomes +1 or −1. A range in which the counter comparison result becomes +1 or −1 changes depending on the comparison fixed-point bit width n of FIG. 3 and the comparison method in the comparator 582 of FIG. 3. Here, the comparison method refers to whether the count conversion value is rounded or truncated to the significant digits after a digits alignment process in the shift calculator 581*b* of FIG. 3.

When the counter comparison result remains at 0, the difference between the PWM count value and the count conversion value monotonically decreases or increases. FIGS. 6A and 6B illustrate the case of monotonically decreasing, and when the count conversion value falls below a predetermined range for the PWM count value (a range between a broken line and an alternating long and short dash line in the figures), the counter comparison result becomes 1 and the counter increment value is corrected in a positive direction. As a result, in a next cycle, the count conversion value returns to the predetermined range for the PWM count value again (the counter comparison result becomes 0). Note that, when the comparison fixed-point bit width n increases by 1, a range in which the counter comparison result in FIG. 6A and FIG. 6B is 0 narrows by half.

As illustrated in FIG. 6A and FIG. 6B, when the number of delay clocks Cd=1, the count increment value is corrected, and the count comparison result returns to 0 at a next clock after the counter comparison result changes to 1 or −1.

Figure 7A:
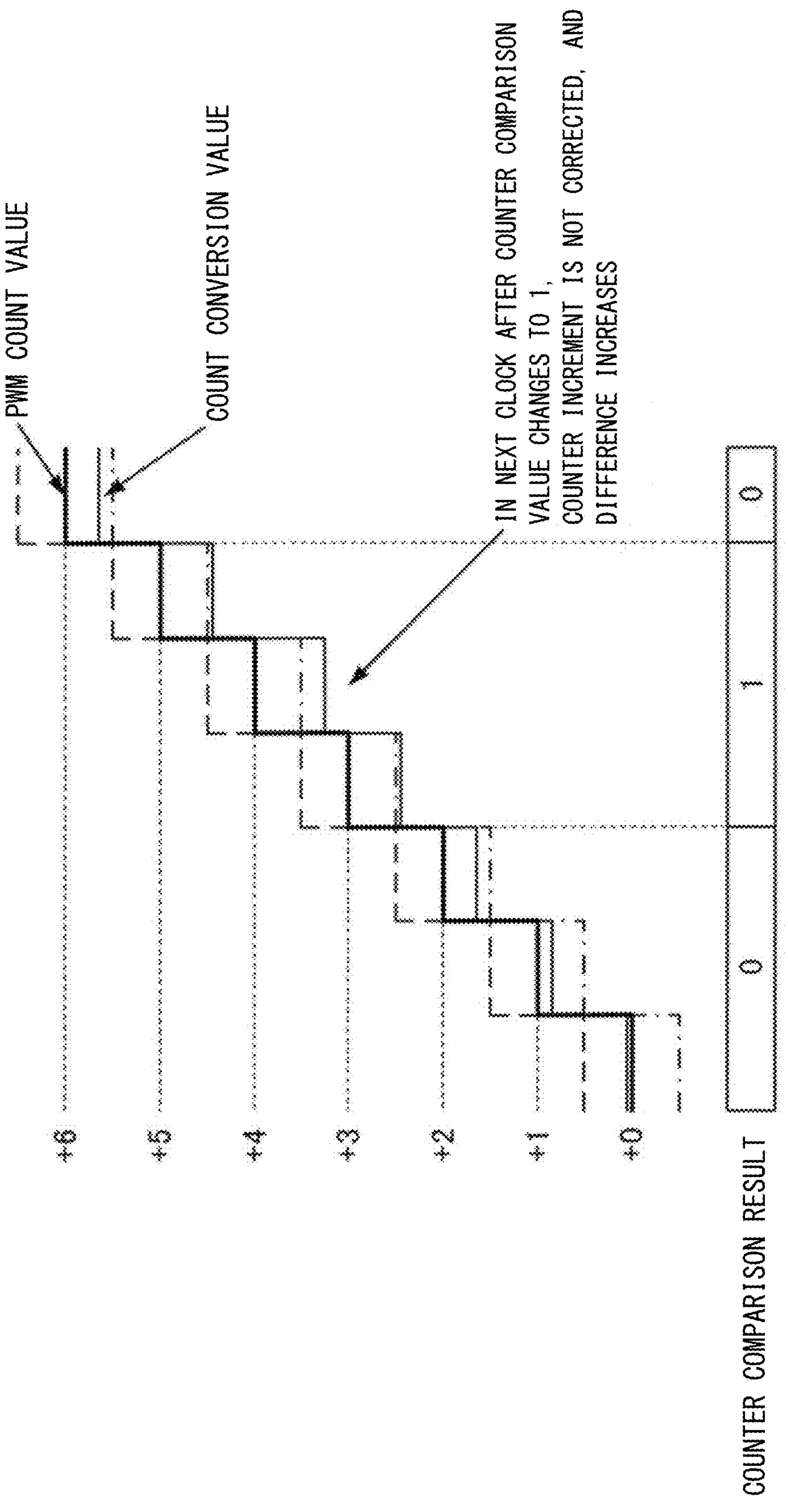
FIG. 7A is an explanatory diagram of a relationship between a PWM count value and a count conversion value (Cd=2) according to an embodiment.
Figure 7B:
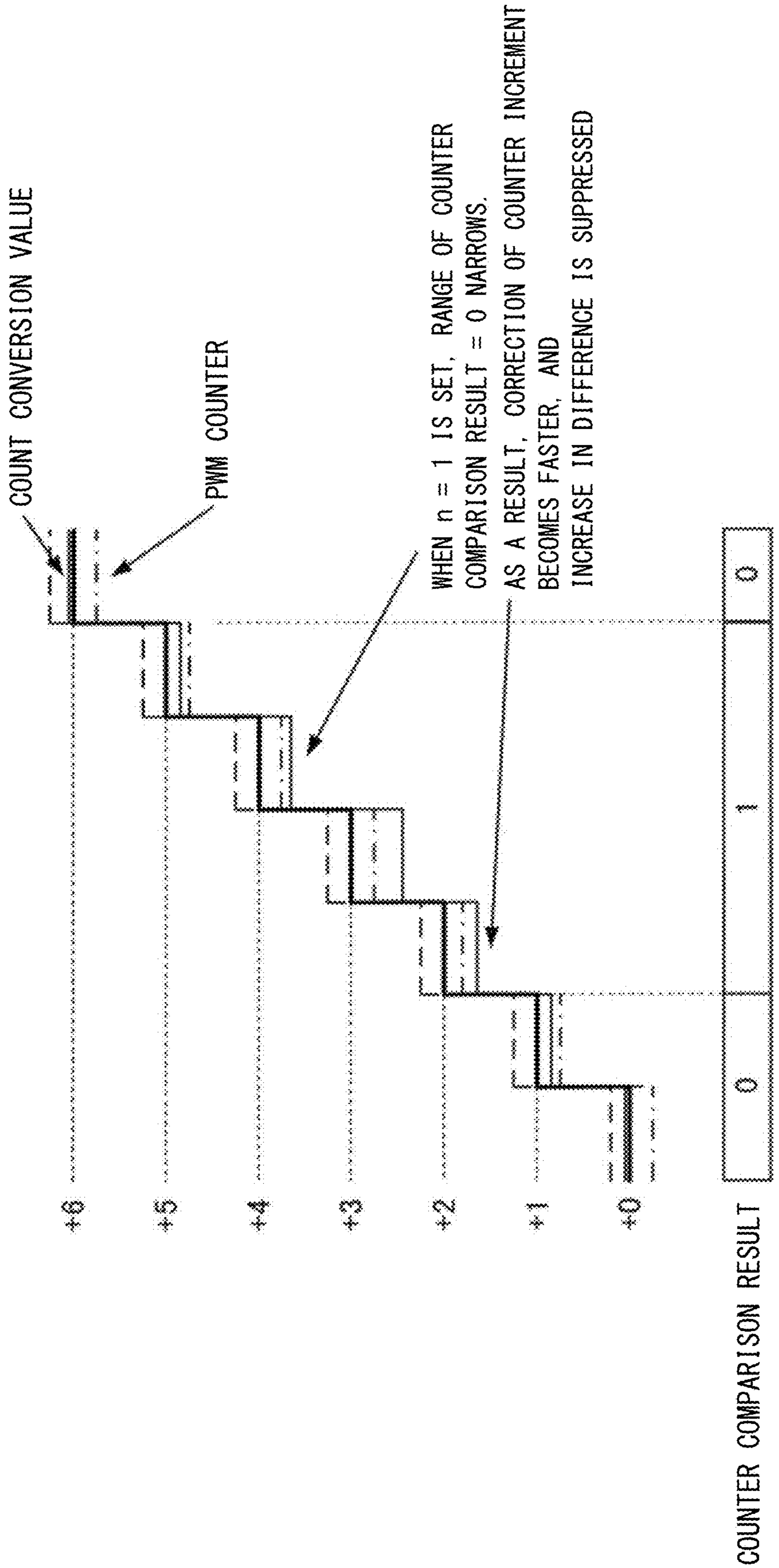
FIG. 7B is an explanatory diagram of a relationship between a PWM count value and a count conversion value (Cd=2) according to an embodiment.

FIG. 7A and FIG. 7B are examples of timing charts of the PWM count value and the count conversion value when the number of delay clocks Cd=2. FIG. 7A illustrates a case where the comparison fixed-point bit width n=0. FIG. 7B illustrates a case where the comparison fixed-point bit width n=1. When the number of delay clocks Cd=2, as illustrated in FIG. 7A and FIG. 7B, the counter increment value is not corrected at a next clock after the counter comparison result changes to 1 or −1, and thus the difference between the PWM count value and the counter conversion value increases as compared to the case where Cd=1.

Therefore, as illustrated in FIG. 7B, a range where the counter comparison result is 0 may be narrowed by half by setting the comparison fixed-point bit width n=1. In this way, the counter comparison result changes to 1 or −1 more quickly, and the counter increment value is corrected more quickly accordingly. As a result, it is possible to suppress an increase in the difference between the PWM count value and the count conversion value that occurs when Cd=2.

Note that it might be better to determine the comparison fixed-point bit width n used in comparison of the comparator 582 of FIG. 3 according to the number of delay clocks Cd. The comparison fixed-point bit width n might be set to satisfy $2^n \geq Cd$ for the number of delay clocks Cd. In this way, in response to delay due to the number of delay clocks Cd, response of the comparator 582 becomes faster, and feedback to the normalization counter 56 of FIG. 1 becomes faster.

Here, setting of the number of counter correction shifts m of the shift calculator 593 of FIG. 4 will be considered. When the counter comparison signal changes from 0 to 1 or from 0 to −1, a state of 1 or −1 continues at least the number of delay clocks Cd. Therefore, the counter correction value needs to be less than or equal to 1/Cd of the counter increment reference value. In addition, the counter correction value needs to be reduced as feedback to the normalization counter 56 of FIG. 1 becomes faster with the number of comparison fixed-point bits n. That is, an optimal value of the number of counter correction shifts m is the smallest integer that satisfies $2^m \geq Cd \times 2^n$, depending on the number of delay clocks Cd and the comparison fixed-point bit width n. The number of counter correction shifts m may be changed by about plus or minus 1 from the optimal value.

A further description will be given of "a smallest integer satisfying $2^m \geq Cd \times 2^n$", which is the optimal value of the number of counter correction shifts m mentioned above. This is considered by setting m=m1+m2, which is divided into a relationship between m1 and n and a relationship between Cd and m2.

The relationship between m1 and n is considered when Cd=1. n is the number of significant bits of the fixed-point part when comparing the PWM counter value and the count conversion value in the counter comparator 58. Therefore, a width of a range in which the counter comparison result=0 illustrated in FIGS. 6A, FIG. 6B, FIG. 7A, and FIG. 7B is $1/2^n$.

When Cd=1, the counter increment amount of the normalization counter 56 is corrected at a next clock after the counter comparison result changes to +1 or −1, so that the counter comparison result between the PWM count value and the count conversion value is returned to 0. Therefore, a correction value of the counter increment value is within a range in which the counter comparison result can be corrected to 0 in a unit system of the PWM count value; that is, equivalent to ½^n. This is the meaning of the above-mentioned "The counter correction value needs to be reduced as feedback to the normalization counter 56 of FIG. 1 becomes faster with the number of comparison fixed-point bits n."

When the correction amount ½^n of the counter increment value in the unit system of the PWM count value is changed to a counter correction reference value ΔCc' in the unit system of the normalization count value, the following Equation (7) is obtained. Note that this equation uses the above Equation (6).

$$\begin{aligned}\Delta Cc' &= 1/2^{\wedge}n \times 2^{\wedge}N/C\max \\ &\approx 1/2^{\wedge}n \times 2^{\wedge}N/C\max 0 \\ &\approx \Delta C/2^{\wedge}n\end{aligned} \tag{7}$$

From the above Equation (7) and the description of the shift calculator 593 (see FIG. 4) mentioned above, "shift ΔC to the right by m bits; that is, extract the mth bit as the LSB and output the counter correction reference value ΔCc", when m1=n and Cd=1, the counter correction reference value ΔCc' is given by the following Equation (8).

$$\Delta Cc' = \Delta C/2^{\wedge}m1 = \Delta C/2^{\wedge}n \tag{8}$$

The relationship between Cd and m2 is based on the above statement that "When the counter comparison signal changes from 0 to 1 or from 0 to −1, a state of 1 or −1 continues at least the number of delay clocks Cd. Therefore, the counter correction value needs to be less than or equal to 1/Cd of the counter increment reference value." The above statement is based on the assumption that n=0, and thus when the "counter increment reference value" is replaced with a counter correction reference value Cc' when Cd=1, the following Inequality (9) is obtained.

$$\begin{aligned}\Delta Cc'/2^{\wedge}m2 &\le \Delta Cc'/Cd \\ \Delta C/2^{\wedge}(m1+m2) &\le \Delta C/2^{\wedge}n/Cd \\ \Delta C/2^{\wedge}m &\le \Delta C/2^{\wedge}n/Cd \\ 2^{\wedge}m &\ge Cd \times 2^{\wedge}n\end{aligned} \tag{9}$$

From the above Inequality (9), "the smallest integer satisfying 2^m≥Cd×2^n," which is the optimal value of the number of counter correction shifts m, is obtained. Note that, in FIG. 4, when the counter increment reference value ΔC and the number of counter correction shifts m satisfy the relationship ΔC<2^m, the counter correction reference value ΔCc becomes 0, and thus feedback to the normalization counter 56 of FIG. 1 does not function. In other words, when m is excessively large, feedback to the normalization counter 56 does not function. To prevent this, the "smallest integer" is used in the above condition (condition for the optimal value of the number of counter correction shifts m).

As described above, in FIG. 4, when the counter increment reference value ΔC and the number of counter correction shifts m satisfy a relationship ΔC<2^m, the counter correction reference value ΔCc becomes 0, and thus feedback to the normalization counter 56 of FIG. 1 does not function. Therefore, to satisfy ΔCc≥1, fixed-point bits having a bit width of m or less may be added to an internal count value of the normalization counter 56 and a count increment reference value set in the counter increment reference value storage 60 of FIG. 1. Even when fixed-point bits are added, the normalization counter 56 outputs only the integer part as a normalization count value.

Figure 8:
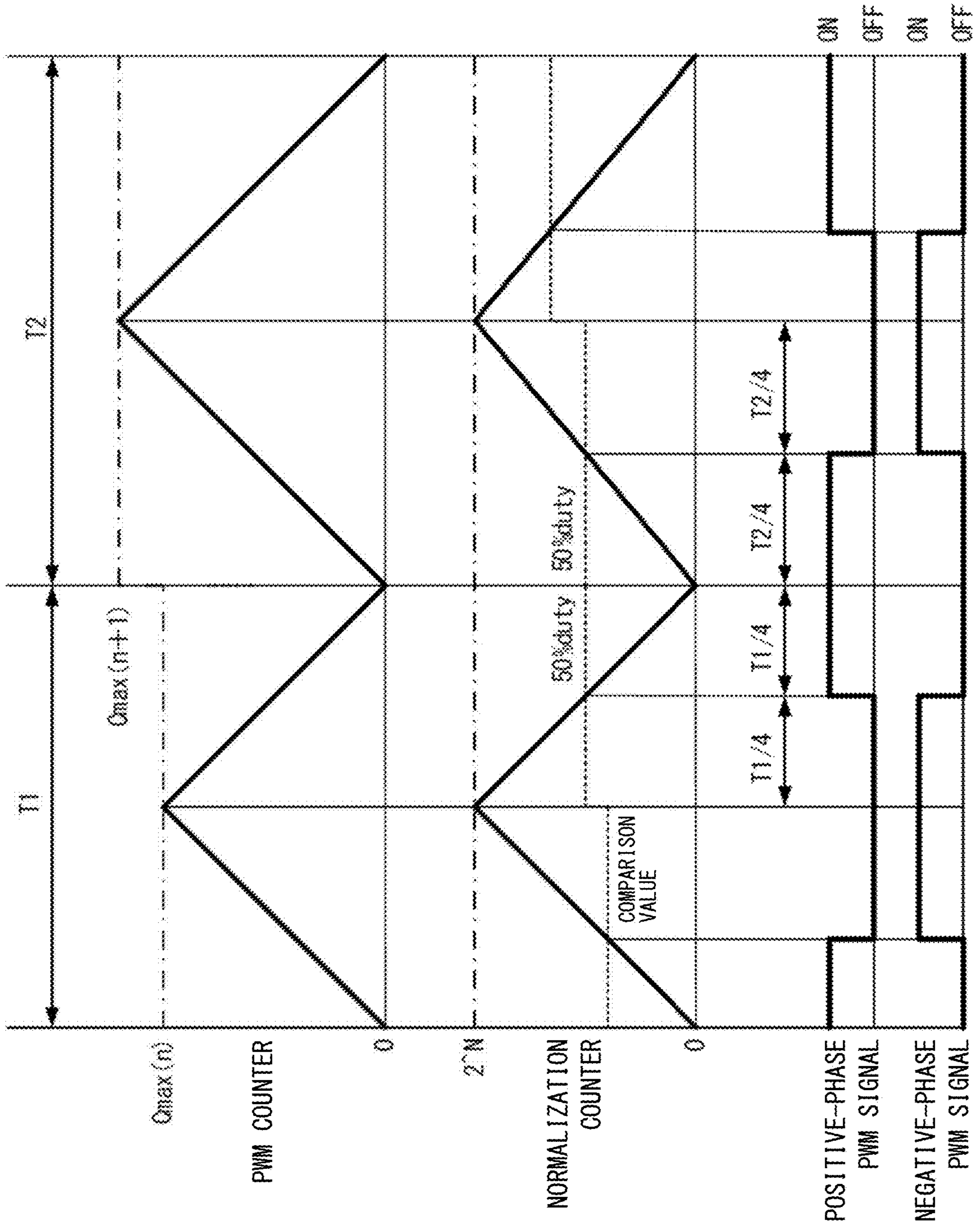
FIG. 8 is a timing chart of a normalization PWM circuit according to an embodiment.
Figure 9:
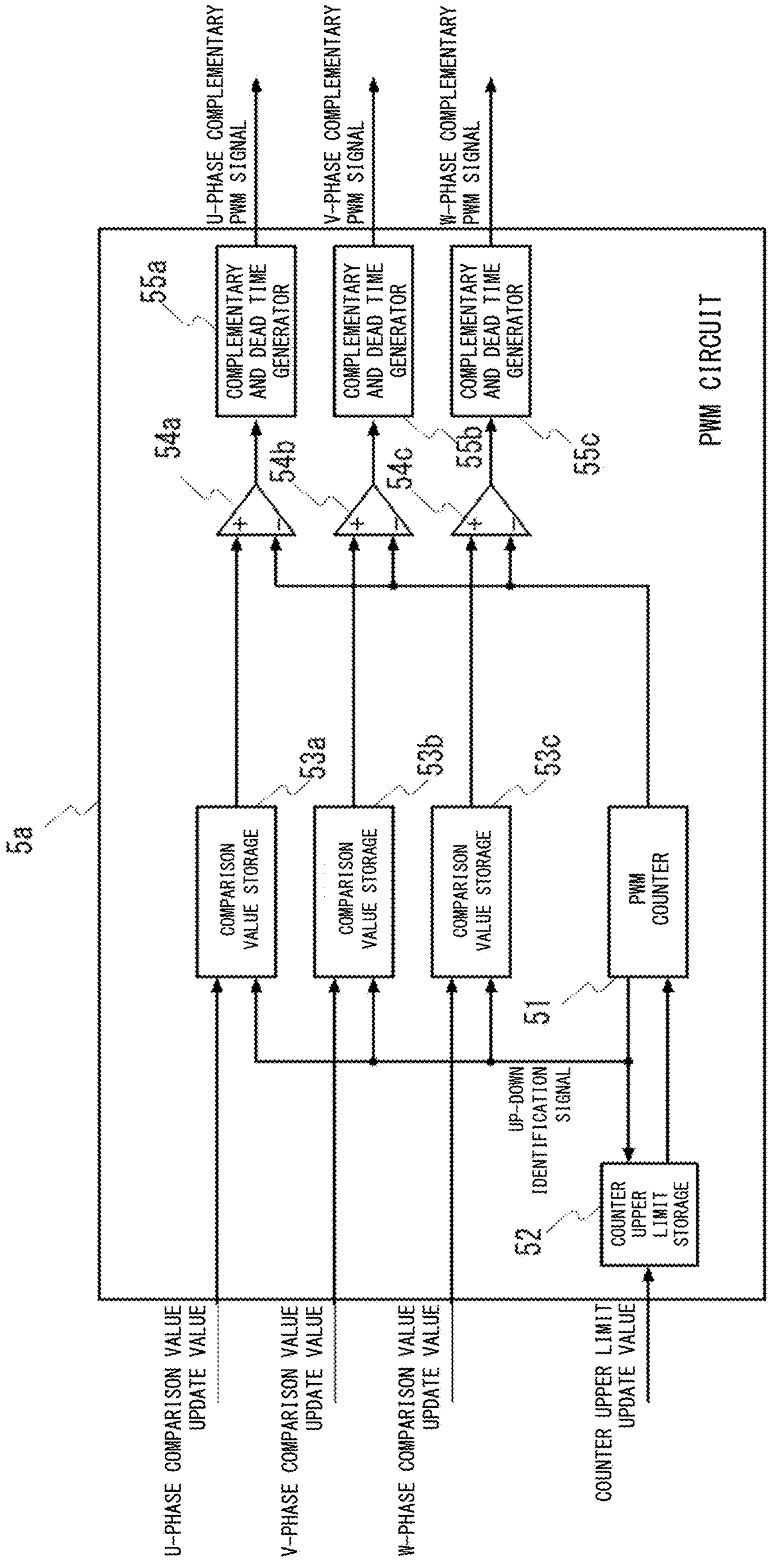
PRIOR ART FIG. 9
FIG. 9 is a block diagram illustrating a PWM circuit in a conventional art.
Figure 10:
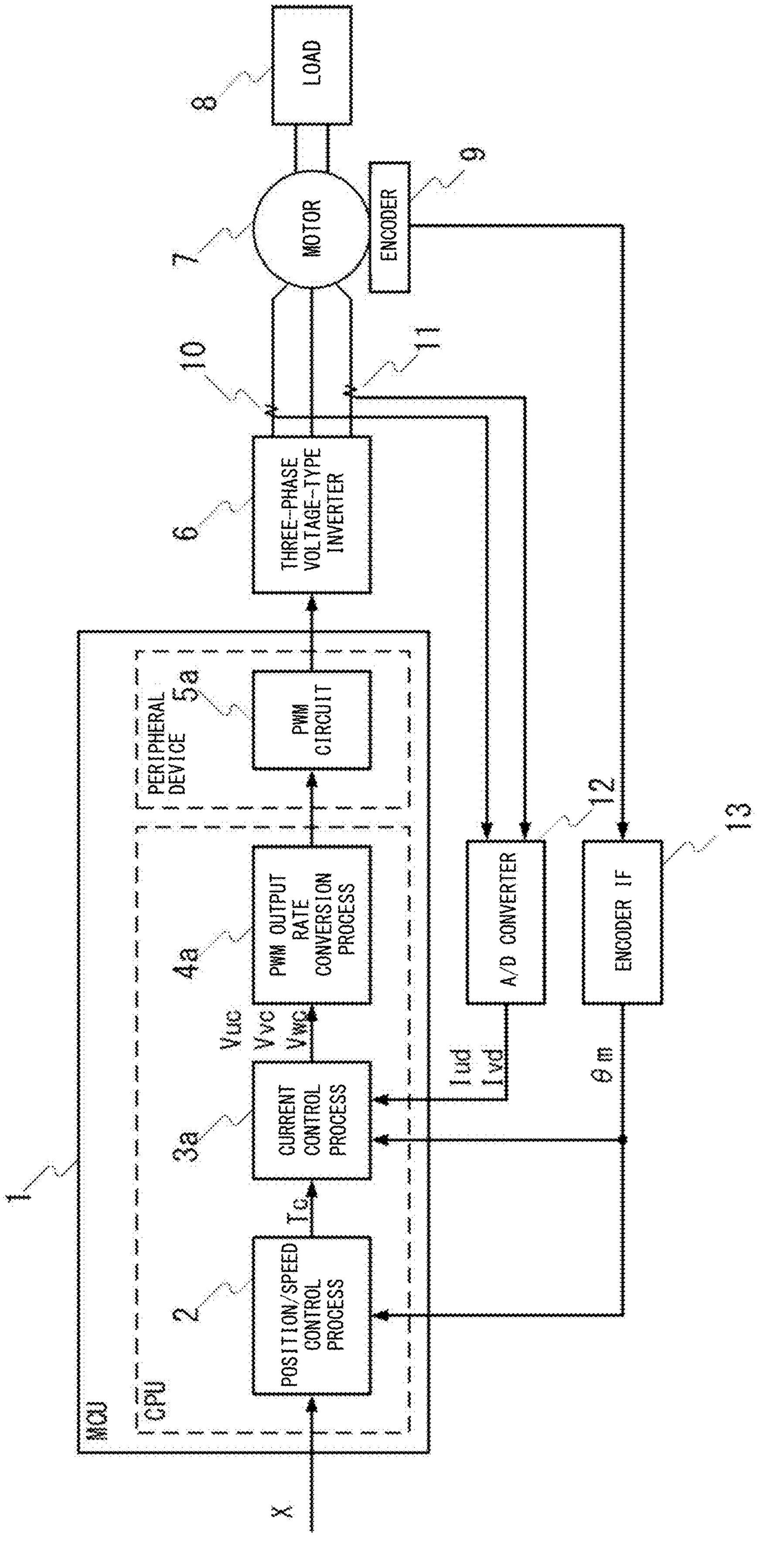
PRIOR ART FIG. 10
FIG. 10 is a block diagram illustrating a motor system in a conventional art.
Figure 12:
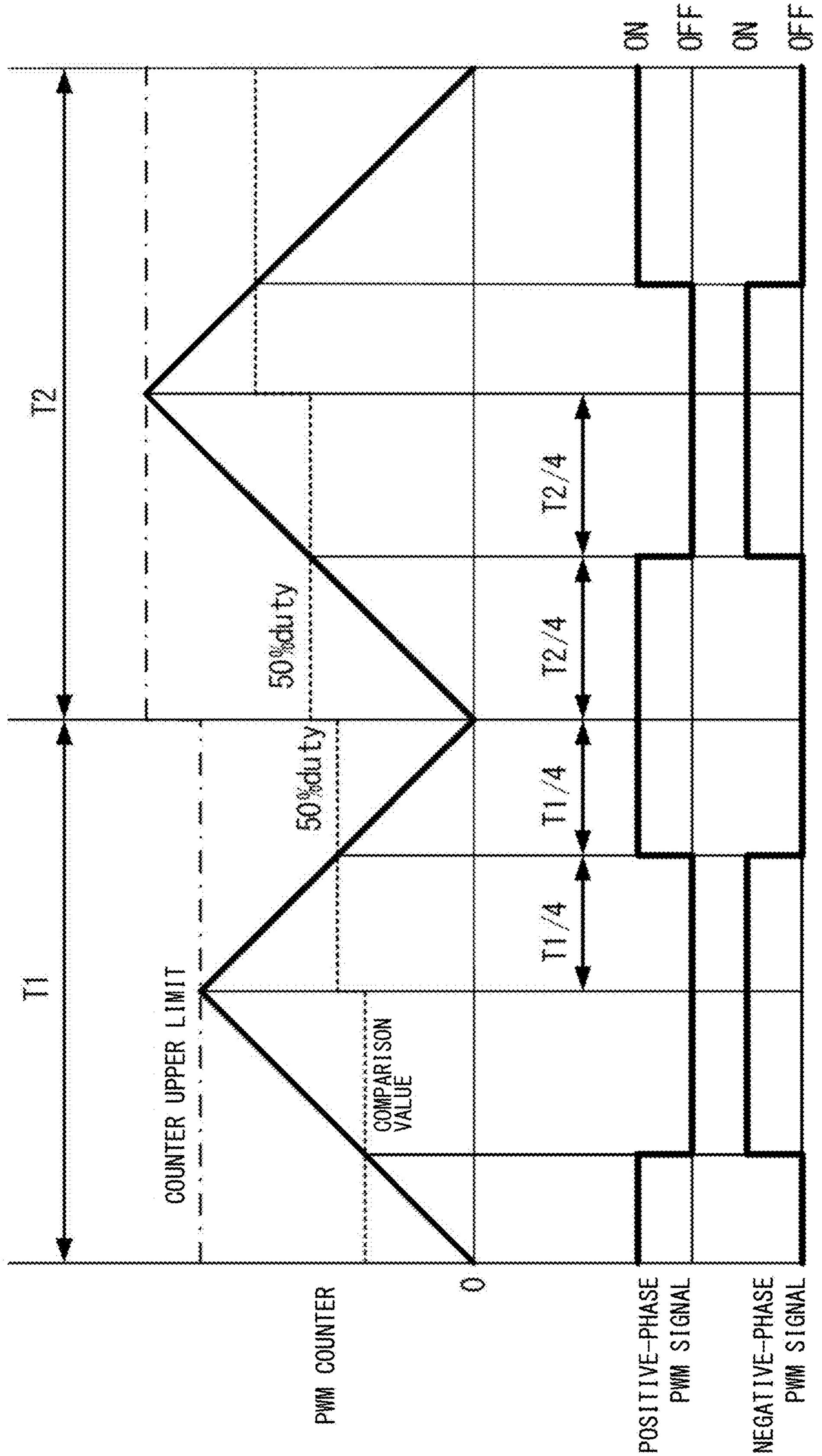
PRIOR ART FIG. 12
FIG. 12 is a timing chart of a PWM circuit in a conventional art.

FIG. 8 is a timing chart of the normalization PWM circuit of the present embodiment and illustrates an example of outputting a PWM signal equivalent to that of FIG. 12. The PWM counter 51 counts up and down between 0 and the counter upper limit Cmax(n), and the normalization counter 56 counts up and down between 0 and 2^N in synchronization with the PWM counter 51. That is, when the PWM counter 51 counts up from 0 to the counter upper limit Cmax(n) with a slope of 1, the normalization PWM counter counts up from 0 to 2^N with an average slope of 2^N/Cmax (n), and when the PWM counter 51 counts down from the counter upper limit Cmax(n) to 0 by −1, the normalization PWM counter counts down from 2^N to 0 with an average slope of 2^N/Cmax(n). The positive-phase PWM signal and the negative-phase PWM signal are generated by comparing a value of normalization counter 56 with a comparison value, not a value of the PWM counter 51. Therefore, unlike the conventional art of FIG. 12, the comparison value remains constant even when a carrier period is changed.

Figure 11:
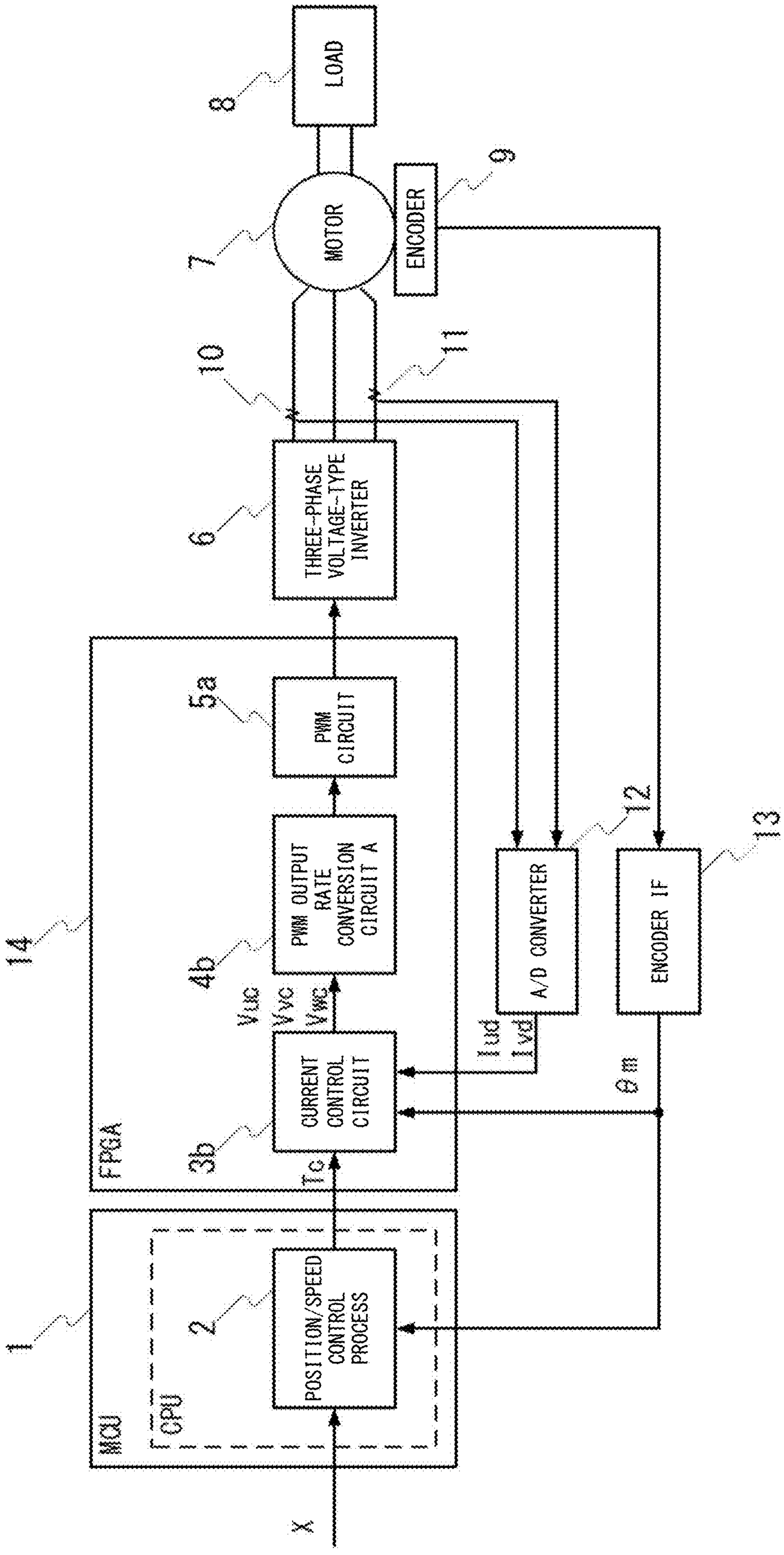
PRIOR ART FIG. 11
FIG. 11 is a block diagram illustrating another motor system in a conventional art.

By configuring the PWM circuit as the normalization PWM circuit 5*b*, the PWM output rate conversion circuit B (reference symbol 4*c*) of FIG. 2 is simplified compared to the PWM output rate conversion circuit A (reference symbol 4*b*) of FIG. 11. That is, by substituting Cmax=2^N and N=N'+1 into the above Equations (2) to (4), Equations (10) to (12) below are obtained, and the PWM output rate conversion circuit B (reference symbol 4*c*) can be configured using only an addition process without a multiplication circuit.

$$U\text{-phase comparison value update value} = Vuc + 2^{\wedge}N' \tag{10}$$

$$V\text{-phase comparison value update value} = Vvc + 2^{\wedge}N' \tag{11}$$

$$W\text{-phase comparison value update value} = Vwc + 2^{\wedge}N' \tag{12}$$

So far, as a configuration example of the present embodiment, a description has been given of a configuration example using a so-called triangular wave PWM, in which a counter that counts up and down is used as a carrier for the PWM signal. However, the scope of the disclosure is not limited to the triangular wave PWM. For example, the disclosure can be easily applied to a so-called sawtooth wave PWM, in which counting up is continued by clearing to 0 after reaching a counter upper limit as a carrier for the PWM signal.

In the configuration example of FIG. 1, the positive-phase PWM signal and the negative-phase PWM signal with dead times are generated by the complementary and dead time generators 55*a*, 55*b*, and 55*c* for PWM signals output by the comparators 54*a*, 54*b*, and 54*c*. However, this does not limit the scope of application of the disclosure. For example, a combination with various known methods of outputting a complementary PWM signal is allowed. For example, the count value of the normalization counter 56 is compared with a comparison value for a positive phase and a comparison value for a negative phase by a comparator, and a positive-phase PWM signal and a negative-phase PWM signal are output.

The invention claimed is:

1. A PWM control apparatus comprising a normalization counter configured to count up or down by an average of 2^N/Cmax between 0 and 2^N for each input of a clock signal, wherein:
- N is a natural number,
- Cmax is a value changing according to a carrier period, and
- the PWM control apparatus further comprises a comparator configured to compare a normalization count value of the normalization counter with a comparison value for determining a duty ratio of a PWM signal and output a comparison result as a PWM signal;
- further comprising:
  - a PWM counter configured to count up or down by 1 between 0 and Cmax for each input of the clock signal,
  - counter comparison means configured to compare a count conversion value, which is a product of the normalization count value and Cmax, with a PWM count value of the PWM counter after digits alignment, and output a result as a counter comparison result; and
  - counter increment calculation means, wherein:
    - 2^N/Cmax is defined as a counter increment reference value ΔC,
    - the counter increment calculation means is configured to
      - acquire, as a provisional counter increment value, ΔC when the PWM counter is counted up and −ΔC when the PWM counter is counted down,
      - acquire a value obtained by shifting ΔC to right by m bits as a counter correction reference value ΔCc,
      - acquire, as a counter correction value, ΔCc when the PWM counter value is greater than the count conversion value in the counter comparison result, −ΔCc when the PWM counter value is less than the count conversion value, and 0 when the PWM counter value is equal to the count conversion value, and
      - acquire, as a counter increment value, a value obtained by adding the counter correction value to the provisional counter increment value, and
    - the normalization counter updates a normalization count value by adding the count increment value to a current normalization count value when the clock signal is input.

2. The PWM control apparatus according to claim 1, wherein:
- the counter comparison means performs comparison with the PWM count value of the PWM counter by digits alignment using, as significant digits, digits up to an nth decimal point among N fixed-point digits included in the count conversion value, and
- n satisfies a relationship of 2^n≥Cd with respect to a number of delay clocks Cd until the normalization count value is reflected in update of the normalization count value via the counter comparison means and the counter increment calculation means.

3. The PWM control apparatus according to claim 2, wherein m, which is a shift amount of the counter correction reference value ΔCc, satisfies a relationship of m0−1≤m ≤m0+1 with respect to a smallest integer m0 satisfying 2^m0 ≥Cd ×2^n for n in digits alignment of the counter comparison means and the number of delay clocks Cd.

4. The PWM control apparatus according to claim 3, wherein fixed-point bits less than or equal to the m bits are added to an internal count value of the normalization counter and the counter increment reference value of the counter increment calculation means so that ΔC/2^m does not become 0 with respect to ΔC and m.

* * * * *